(12) United States Patent
Rivoir

(10) Patent No.: US 7,512,858 B2
(45) Date of Patent: Mar. 31, 2009

(54) METHOD AND SYSTEM FOR PER-PIN CLOCK SYNTHESIS OF AN ELECTRONIC DEVICE UNDER TEST

(75) Inventor: Jochen Rivoir, Magstadt (DE)

(73) Assignee: Verigy (Singapore) Pte. Ltd., Singapore (SG)

( * ) Notice: Subject to any disclaimer, the term of this patent is extended or adjusted under 35 U.S.C. 154(b) by 551 days.

(21) Appl. No.: 11/158,499

(22) Filed: Jun. 22, 2005

(65) Prior Publication Data

US 2005/0289427 A1 Dec. 29, 2005

(30) Foreign Application Priority Data

Jun. 24, 2004 (EP) .................... 04102924

(51) Int. Cl.
*G01R 31/28* (2006.01)
(52) U.S. Cl. ........................ 714/744
(58) Field of Classification Search .................. 714/744
See application file for complete search history.

(56) References Cited

U.S. PATENT DOCUMENTS

| | | | |
|---|---|---|---|
| 5,153,883 A * | 10/1992 | Hayashi et al. ............. | 714/744 |
| 5,515,404 A | 5/1996 | Pearce et al. | |
| 5,727,193 A | 3/1998 | Takeuchi | |
| 6,175,939 B1 * | 1/2001 | Dinteman .................... | 714/724 |
| 6,188,253 B1 * | 2/2001 | Gage et al. ................... | 327/105 |
| 6,275,057 B1 | 8/2001 | Takizawa | |
| 6,469,493 B1 | 10/2002 | Conner et al. | |
| 6,553,529 B1 * | 4/2003 | Reichert ..................... | 714/738 |
| 6,976,183 B2 * | 12/2005 | Gage et al. .................. | 713/500 |
| 7,093,177 B2 * | 8/2006 | West et al. ................... | 714/738 |

FOREIGN PATENT DOCUMENTS

| | | |
|---|---|---|
| EP | 882991 | 3/1999 |
| EP | 859318 | 7/1999 |
| EP | 864977 | 7/1999 |
| EP | 886214 | 10/1999 |
| EP | 1092983 | 1/2003 |
| WO | WO 03/042710 A | 5/2003 |

* cited by examiner

*Primary Examiner*—James C Kerveros
(74) *Attorney, Agent, or Firm*—Holland & Hart, LLP

(57) ABSTRACT

A method and system for synthesizing digital clock signals for an electronic device under test having a plurality of pins, said method including generating centrally a reference clock, and distributing said reference clock to a number of electronic circuits, each of said electronic circuit having a test signal processor controlling electrically said pins of said device under test with predetermined signal pattern, characterized by synthesizing locally at said test signal processor a digital clock signal, said digital clock signal being individual for said pin of said device under test electrically controlled by said test signal processor.

15 Claims, 4 Drawing Sheets

METHOD AND SYSTEM FOR PER-PIN CLOCK SYNTHESIS OF AN ELECTRONIC DEVICE UNDER TEST

PRIORITY CLAIM

Foreign priority rights under Title 35, United States Code Section 119, to EPO Application Number 04102924.0, filed Jun. 24, 2004, are hereby claimed.

BACKGROUND

The present invention relates to an improvement of clock synthesis for multiple channels in Automated Test Equipment (ATE) including phase and frequency synchronization between channels with possibly different frequencies.

Integrated Circuits (IC) generally need to be tested to assure proper operation. This—in particular—is required during IC development and manufacturing. In the latter case, the ICs are usually tested before final application. During test, the IC, as Device Under Test (DUT), is exposed to various types of stimulus signals, and its responses are measured, processed and usually compared to an expected response of a good device. Automated Test Equipments (ATE) usually perform these tasks according to a device-specific test program. Examples for ATE are the Agilent 83000 and 93000 families of Semiconductor Test Systems of Agilent Technologies as disclosed e.g. under http://www.ate.agilent.com/ste/products/intelligent test/SOC test/SOC Tech Oview.shtml. Details of those families are also disclosed e.g. in EP-A-859318, EP-A-864977, EP-A-886214, EP-A-882991, EP-A-1092983, U.S. Pat. Nos. 5,499,248, 5,453,995.

Automated Test Equipment (ATE) is usually structured using cards comprising electronic circuits, each of said cards controlling electrically a couple of pins of said device under test (DUT) with a predetermined signal pattern by test signal processors. A number of cards are arranged in a card cage, respectively, and a number of card cages usually form the ATE.

A frequency reference can be provided centrally from which one or few synchronized master clocks (MCLK) with typically few 100 MHz can be derived and synchronized centrally and distributed to said cards. The card clock (CCLK) can be selected locally at said card from said few master clocks (MCLK).

Alternatively, a clock can be synthesized on card level using a central frequency reference and synchronizing said card clock to a central synchronization signal (SYNC) feeding direct digital synthesis (DDS) and following phase locked loop (PLL).

BRIEF DESCRIPTION OF THE DRAWINGS

Other objects and many of the attendant advantages of the present invention will be readily appreciated and become better understood by reference to the following detailed description when considering in connection with the accompanied drawings. Features that are substantially or functionally equal or similar will be referred to with the same reference signs.

DETAILED DESCRIPTION

It is an object of the invention to provide an improved clock synthesis. It is a further object to improve testing of electronic devices by using the improved clock synthesis.

According to the present invention, the clock is synthesized pin-individually, i.e. the present invention relates to a per-pin clock synthesis.

In an embodiment a reference frequency and thus a reference clock (RCLK) is generated centrally and distributed to said cards, i.e. to electronic circuits comprising test signal processors, each of which control electrically a pin of said DUT. Each test signal processor may control one single pin of said DUT respectively. A pin-individual clock (PCLK) is synthesized and clock modulation under pin control is possible, including frequency, phase and/or amplitude modulation of said PCLK.

A super-period clock (SCLK) may be generated centrally and distributed to said pin-individual control, wherein said SCLK is generated by a N/M division of said RCLK with N and M being integer and N<M. The PCLK can be synchronized to said SCLK. Synthesis and synchronization of PCLK can be monolithically integrated in said test signal processor.

This results in lowest jitter, i.e. in clean high-speed clock with noise pickup is only below tracking speed, in particular the important high-speed jitter is suppressed in PLL, and any jitter from noise picked-up on card is avoided. Cost and performance limitations resulting from fast digital-to-analog converter (DAC) in DDS are avoided. Clock frequency and/or phase is fully under pin control and can be modulated pin-individually.

The present invention also relates to a software program or product for executing the method for synthesizing digital clock signals when running on a data processing system such as a computer. The program or product may be stored on a data carrier.

Furthermore, the present invention relates to a system for synthesizing digital clock signals.

Figure 1:
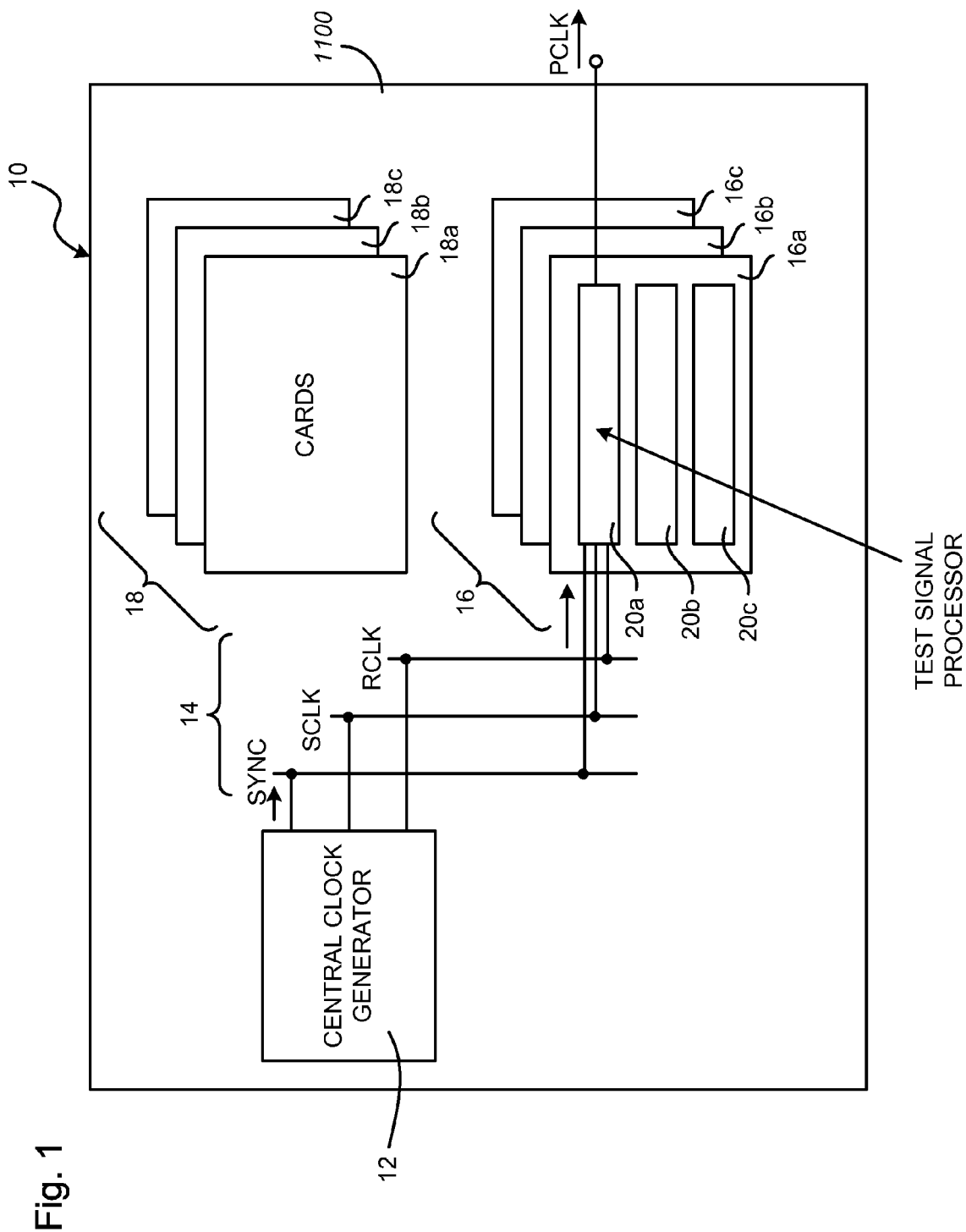
FIG. 1 shows a block diagram of a system for synthesizing digital clock signals.

FIG. 1 shows a block diagram of a system 10 for synthesizing digital clock signals PCLK for an electronic device under test DUT (not shown), i.e. an automated test equipment ATE. The system 10 comprises a central clock generator 12, clock distribution lines 14 distributing the centrally generated clock signals RCLK and SCLK and synchronization signal SYNC to a number of cards 16a to 16c and 18a to 18c, which are arranged in card cages 16 and 18 respectively.

Each card 16a to 16c and 18a to 18c can comprise a number of test signal processors 20a to 20c each controlling one pin of said DUT, i.e. stimulating the corresponding pin and detecting the electrical response on the stimulus. Said central clock generator 12 providing and distributing a reference clock RCLK, a super-period clock SCLK, and a synchronization signal SYNC, wherein SCLK and SYNC are derived from RCLK as described below.

Figure 2:
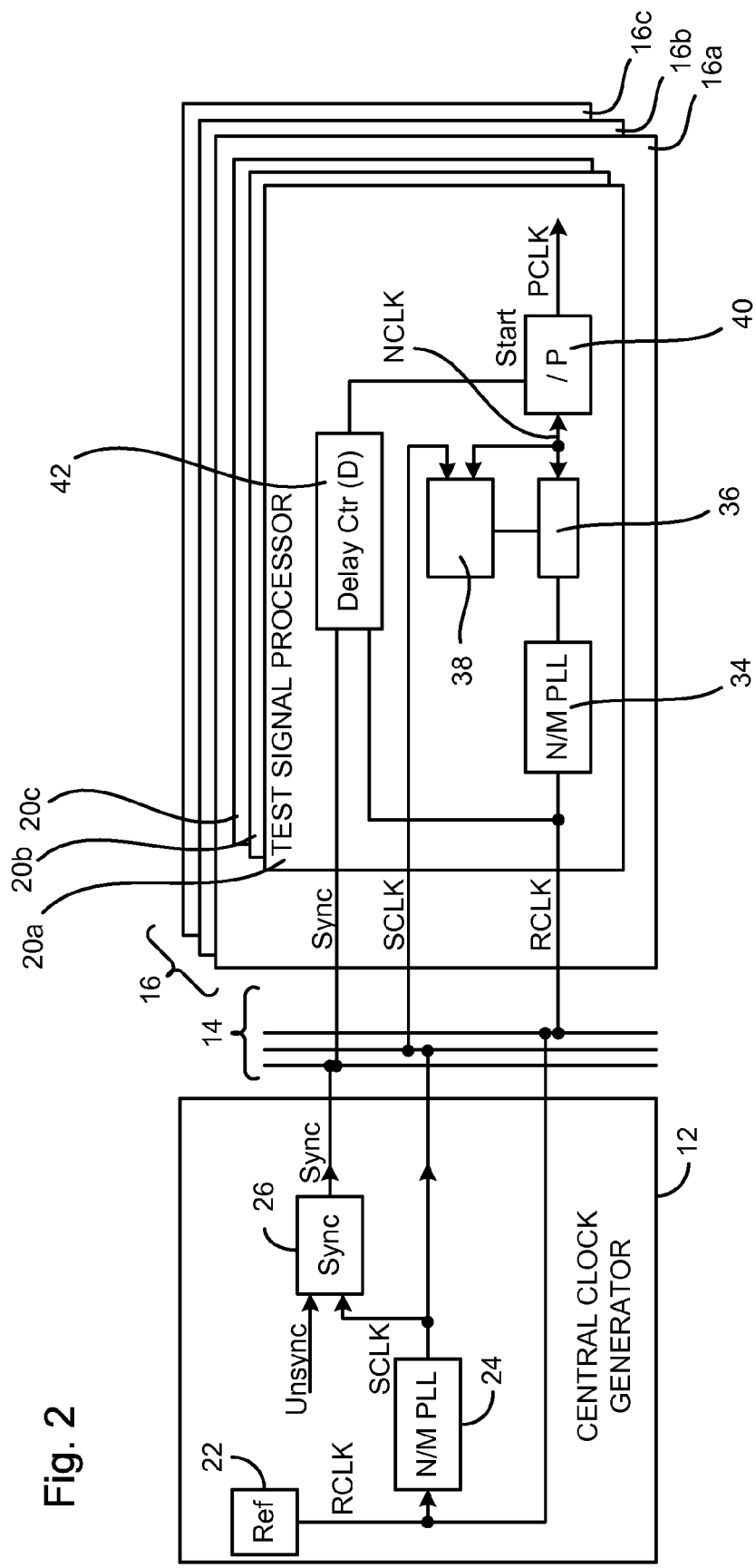
FIG. 2 shows the arrangement of central clock generator and test signal processor in more detail.

FIG. 2 shows the arrangement of central clock generator 12 and test signal processor 20a in more detail. The central clock generator 12 may be provided centrally for the system 10 and comprises a reference frequency generator 22 generating a reference clock RCLK which is distributed by distribution lines 14 to all test signal processors 20a of all cards 16a to 16c of all card cages 16, 18. Within the central clock generator 12 a super-period clock SCLK is synthesized by a N/M division 24 of RCLK wherein N and M are integer with N<M and with subsequent phase locked loop PLL; furthermore a sychronizing signal SYNC is derived from SCLK by synchronizer 26. Said SCLK and said SYNC are also distributed by distribution lines 14 to all test signal processors 20a.

In the described embodiment the card 16a comprises three test signal processors 20a to 20c, to each of which the signals RCLK, SCLK and SYNC are distributed, each of the test signal processor 20a to 20c controlling one pin of the DUT individually. SCLK is set to lowest common multiple of all pin periods that need to be synchronized. After every super-period all PCLK have the same phase. Within the test signal processor 20a the RCLK is subject to a N/M division 34 wherein N and M are integer with N<M and with subsequent PLL. The resulting clock signal is inputted in a delay element 36 that is capable to provide controllable delay time to adjust the phase of a normalized clock signal NCLK outputted by the delay element 36. The delay element 36 is controlled by a phase detector 38 to which the NCLK is inputted as well as SCLK. After every super-period all PCLK have the same phase. Every pin aligns its NCLK to the super-period. NCLK is inputted in a divider 40 with divisor P resulting in pin-individual clock PCLK. The divider 40 is started by a start signal outputted from a delay counter 42 to which SCLK and RCLK are inputted, wherein the controllable delay is longer than the time needed to align NCLK to SCLK. When all NCLK are aligned, then the divider 40 is started and generates PCLK.

The frequency resolution is determined by the factors N, M, and P. For P=1 the divider 40 can be replaced by a simple gate. It is further possible not to distribute RCLK to the test signal processor 20a but to derive RCLK from SCLK; since SCLK can be low and thus deriving RCLK from low SCLK is not simple, it is nevertheless advantageous to distribute both RCLK and SCLK.

Figure 3:
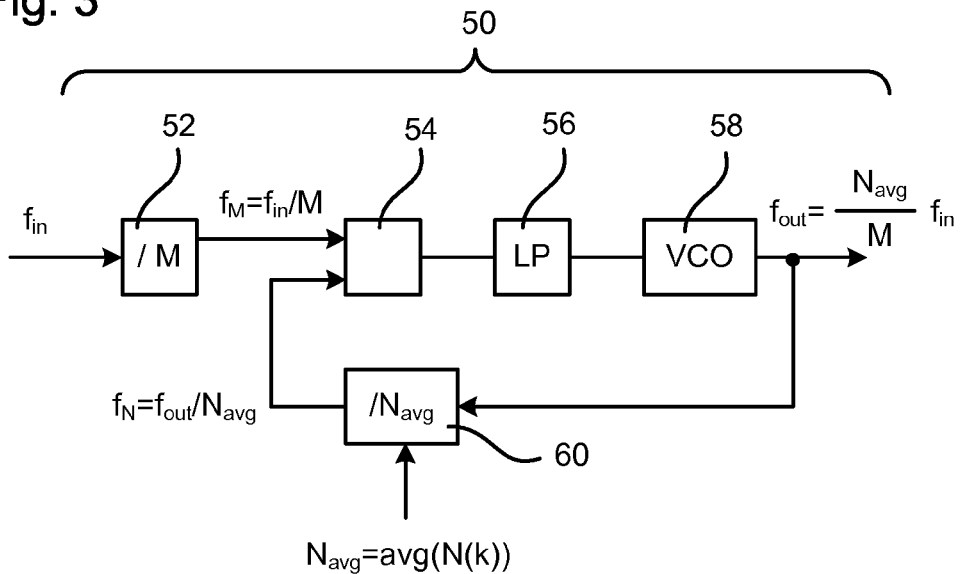
FIG. 3 shows a block diagram for a possible fine frequency resolution for the inventive per pin clock synthesis.

FIG. 3 shows a block diagram for a possible fine frequency resolution for the inventive per pin-clock synthesis with a fractional-N PLL or a delta-sigma-modulated (DSM) fractional-N PLL. The input frequency fin is divided by M using a divider 52 resulting in fM=fin/M which is inputted in a phase detector 54. The output signal of the phase detector 54 is inputted in a low pass filter 56, the output signal of which controls a voltage-controlled-oscillator 58 having an output frequency fout.

The output signal with output frequency fout is feed back to the phase detector 54 via a divider 60 with adjustable divisor Navg being defined as Navg=average of a sequence N(k) of values N. Thus divider 60 having an output signal with frequency fN=fout/Navg which is inputted in the divider 54. Accordingly, the quotient fout/fin of output and input frequency is adjustable as Navg/M, wherein this quotient can be adjusted very fine and particularly fractional of N depending on the values of the sequence N(k). Furthermore, the output signal with output frequency fout has the same phase as the input signal with input frequency fin. Although sometimes such odd frequencies need not necessarily to be phase-synchronized, and thus NCLK needs not be aligned with SCLK, if necessary or at least advantageous, the circuit shown in FIG. 3 provides such synchronization.

Figure 4:
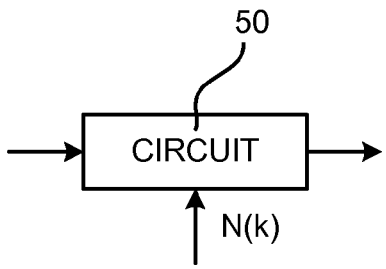
FIG. 4 shows two possible embodiments for providing a sequence N(k)
Figure 4:
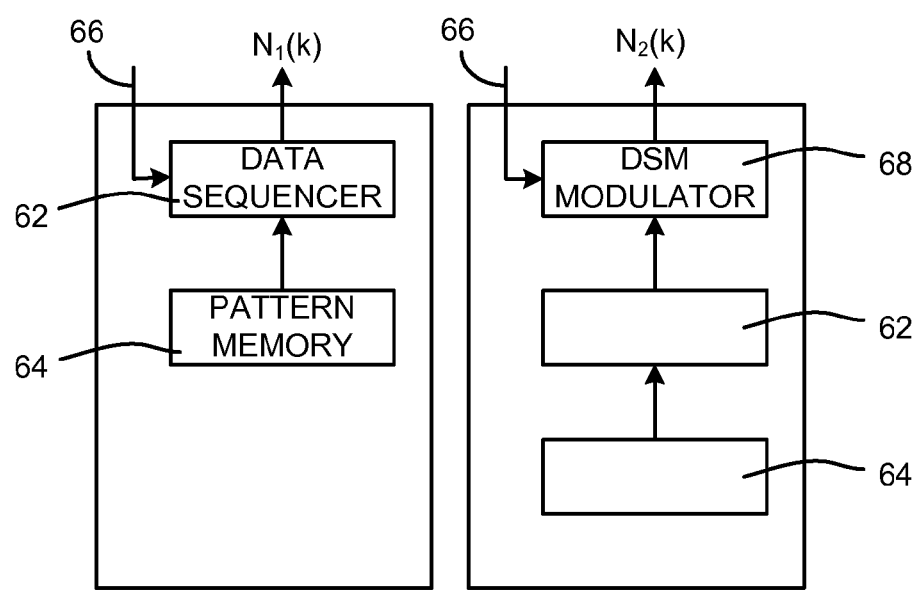

FIG. 4 shows two possible embodiments for providing a sequence N(k) of values N for the divider 60 shown in FIG. 3, whereas the circuit of FIG. 3 described above is shown as block 50, in particular for dynamic frequency variation per pin. The sequence N1(K) can be provided directly by a data sequencer 62 receiving data from a pattern memory 64 and being controlled by control line 66 of a central workstation or a local processor. Alternatively, the sequence N2(k) can be provided by dedicated hardware, e.g. a delta-sigma modulator (DSM) 68, which can be realized in hardware or software.

The pin-individual frequency variation allows fast frequency wobbling or sweeping in order to determine in which frequency range the DUT passes function specifications. Timing and period can be changed within a short time. Analog-to-digital conversion (ADC) clock can be used for non-uniform sampling that reduces aliasing. Modulated intermediate frequency (IF) and radio frequency (RF) signals can be generated by simply sequencing the divider 60 of the circuit 50 shown in FIG. 3 by an appropriate data sequencer or data source.

Figure 5:
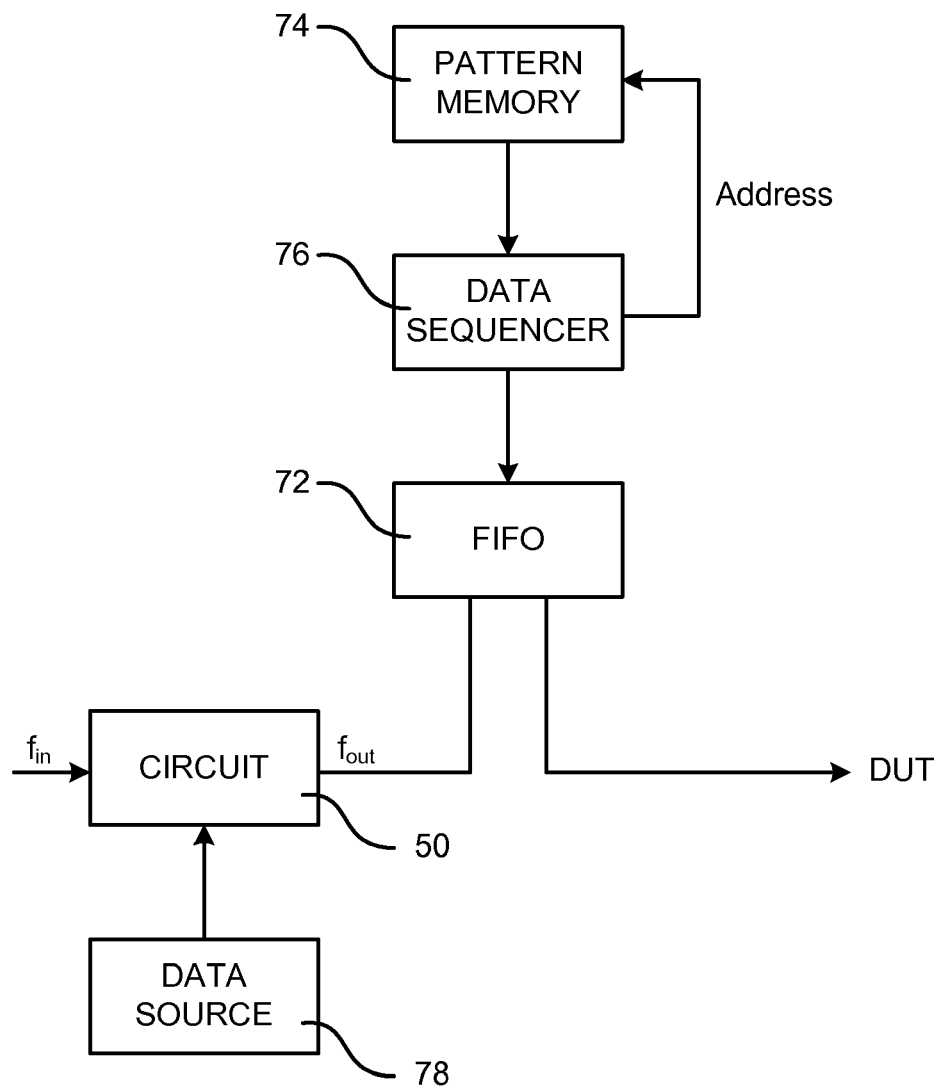
FIG. 5 shows a block diagram of a possible jitter generation in a digital bit stream under pin control.

FIG. 5 shows a block diagram of a possible jitter generation in a digital bit stream under pin control. The circuit shown is FIG. 3 and described above is represented by block 50. The output frequency fout represents a clock modulated according to the data source, i.e. according to the sequence N(K) inputted in the block 50 from a data source 78. Due to the modulation of fout, the output bit stream of first-in-first-out (FIFO) memory which is inputted to the DUT, originating from pattern memory 74 passing a data sequencer 76, comprises a jitter according to the modulation of the output frequency fout.

Only as an example for modifications and/or variations of the present invention it is noted that PLL can also be based on a LC-oscillator or a ring-oscillator. The normalized clock NCLK can be synthesized with N/M PLL, fractional-N PLL, or delta-sigma modulated fractional-N PLL. The RCLK signal can be fix or adjusted application dependent, whereas RCLK can be very low, e.g. in the range of 10 MHz, medium in the range of 100 MHz, or high in the range of 1 GHz or above.

The invention claimed is:

1. A method for synthesizing a plurality of digital clock signals to be applied to respective pins of an electronic device under test comprising a plurality of pins, said method comprising:

generating a reference clock by a central clock generator;

providing said reference clock from said central clock generator to a plurality of electronic circuits, each of said plurality of electronic circuits comprising a test signal processor, each of said test signal processors controlling at least one pin of said device under test for providing a stimulus in accordance with a predetermined signal pattern and for receiving a response to the stimulus; and on the basis of said reference clock, generating at the test signal processor a local digital clock signal, and providing said local digital clock signal to said pin of said device under test controlled by said test signal processor, wherein generating said local digital clock signal comprises modulating at the test signal processor the frequency, phase and/or amplitude of said local digital clock signal for said pin of said device under test controlled by said test signal processor according to digital data stored in a digital data source.

2. The method of claim 1, wherein means for generating said local digital clock signal are monolithically integrated in said test signal processor, such that timing and clock of said signal pattern is generated for each pin in one semiconductor chip.

3. The method of claim 2, wherein at least for some of said pins, an individual test signal processor is provided with integrated means for generating said local digital clock signal.

4. The method of claim 3, wherein for all pins of said device under test, an individual test signal processor is provided with integrated means for generating said local digital clock signal.

5. The method of claim 1, comprising a N/M multiplication of said reference clock, with N and M being integer with N<M, wherein said N/M multiplication of said reference clock is performed by a phase locked loop.

6. The method of claim 5, comprising
synchronizing said N/M multiplied reference clock with a synchronizing signal generated centrally by a N/M multiplication of said reference clock by the phase locked loop, wherein N and M are integer with N<M, and
providing said synchronizing signal to said plurality of electronic circuits.

7. The method of claim 1, wherein a super-period is generated centrally and distributed to said electronic circuits, said super-period is set to lowest common multiple of all clock periods of the local digital clock signals that need to be synchronized.

8. The method of claim 7, wherein said local digital clock signal is synchronized to said super-period.

9. The method of claim 7, wherein said super-period is generated from said reference clock by N/M multiplication, wherein N and M are integers with N<M.

10. The method of claim 9, wherein said local digital clock signal is synchronized to said super-period.

11. A software program or product, stored on a data carrier, for executing the method of claim 1 when running on a data processing system.

12. The method of claim 11, wherein the data processing system is a computer.

13. A system for synthesizing digital clock signals for an electronic device under test having a plurality of pins, said system comprising
means for generating a reference clock by a central clock generator;
means for providing said reference clock from said central clock generator to a plurality of electronic circuits, each of said plurality of electronic circuits comprising a test signal processor, each of said test signal processors controlling at least one pin of said device under test for providing a stimulus in accordance with a predetermined signal pattern and for receiving a response to the stimulus; and
means for generating at the test signal processor a local digital clock signal on the basis of said reference clock, and for providing said local digital clock signal to said pin of said device under test controlled by said test signal processor,
wherein said means for generating said local digital clock signal comprises means for modulating at the test signal processor the frequency, phase and/or amplitude of said local digital clock signal for said pin of said device under test controlled by said test signal processor according to digital data stored in a digital data source.

14. A method for synthesizing a plurality of digital clock signals to be applied to respective pins of an electronic device under test comprising a plurality of pins, said method comprising:
generating a reference clock by a central clock generator;
providing said reference clock from said central clock generator to a plurality of electronic circuits, each of said plurality of electronic circuits comprising a test signal processor, each of said test signal processors controlling at least one pin of said device under test for providing a stimulus in accordance with a predetermined signal pattern and for receiving a response to the stimulus;
on the basis of said reference clock, generating at the test signal processor a local digital clock signal, and providing said local digital clock signal to said pin of said device under test controlled by said test signal processor, wherein generating said local digital clock signal comprises dividing said reference signal clock signal by M and multiplying said divided reference signal clock signal by $N_{avg}$ using a PLL, with M being an integer and $N_{avg}<M$; and
synchronizing said $N_{avg}/M$ divided reference clock signal with a synchronizing signal generated centrally by a N/M multiplication of said reference clock by a phase locked loop, wherein N and M are integer with N<M, wherein said synchronizing signal is provided to said plurality of electronic circuits.

15. A system for synthesizing a plurality of digital clock signals to be applied to respective pins of an electronic device under test comprising a plurality of pins, said method comprising:
means for generating a reference clock by a central clock generator;
means for providing said reference clock from said central clock generator to a plurality of electronic circuits, each of said plurality of electronic circuits comprising a test signal processor, each of said test signal processors controlling at least one pin of said device under test for providing a stimulus in accordance with a predetermined signal pattern and for receiving a response to the stimulus;
means for generating at the test signal processor a local digital clock signal on the basis of said reference clock, and for providing said local digital clock signal to said pin of said device under test controlled by said test signal processor, wherein generating said local digital clock signal comprises dividing said reference signal clock signal by M and multiplying said divided reference signal clock signal by $N_{avg}$ using a PLL, with M being an integer and $N_{avg}<M$; and
means for synchronizing said $N_{avg}/M$ divided reference clock signal with a synchronizing signal generated centrally by a N/M multiplication of said reference clock by a phase locked loop, wherein N and M are integer with N<M, wherein said synchronizing signal is provided to said plurality of electronic circuits.

* * * * *